United States Patent
Hsieh et al.

(10) Patent No.: US 6,549,029 B1
(45) Date of Patent: Apr. 15, 2003

(54) CIRCUIT AND METHOD FOR MEASURING CAPACITANCE

(75) Inventors: Tsung-Hsuan Hsieh, Tainan Hsien (TW); Yao-Wen Chang, Hsinchu (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 16 days.

(21) Appl. No.: 09/990,261

(22) Filed: Nov. 20, 2001

(30) Foreign Application Priority Data

Nov. 9, 2001 (TW) .......................... 90127831 A

(51) Int. Cl.$^7$ .............................................. G01R 31/26
(52) U.S. Cl. ........................................ 324/769; 324/765
(58) Field of Search ................................ 324/658, 765, 324/769, 678, 686, 548; 326/83; 257/48; 327/206, 210

(56) References Cited

U.S. PATENT DOCUMENTS 6,404,222 B1 * 6/2002 Fan et al. ................... 324/765
6,469,538 B1 * 10/2002 Gupta ........................ 324/769

* cited by examiner

Primary Examiner—N. Le
Assistant Examiner—Amy He
(74) Attorney, Agent, or Firm—J. C. Patents

(57) ABSTRACT

A circuit structure for measuring a capacitive load. The capacitive load is coupled between a first and a second nodes, and drains of a first PMOS and a first NMOS transistors are coupled to the first node, and drains of a second PMOS and a second NMOS transistors are coupled to the second node, and a pad is coupled to the second node. First, sources of the first and the second PMOS transistors and sources of the first and the second NMOS transistors are biased at a power source and a ground respectively. A non-synchronized voltage is applied to gates of the first and the second PMOS transistors and to gates of the first and the second NMOS transistors simultaneously. By grounding and floating the pad, a current flowing through the capacitive load is obtained to calculate the capacitance.

20 Claims, 3 Drawing Sheets

CIRCUIT AND METHOD FOR MEASURING CAPACITANCE

CROSS-REFERENCE TO RELATED APPLICATION

This application claims the priority benefit of Taiwan application serial no. 90127831, filed Nov. 9, 2001.

BACKGROUND OF THE INVENTION

1. Field of the Invention

This invention relates in general to a circuit and a method for measuring a capacitance, and more particularly relates to a circuit and a method for measuring a capacitance based upon charges.

2. Description of Related Art

Unavoidably, there are capacitors or capacitive loads formed in an integrated circuit (IC). For understanding effects from the capacitors or capacitive loads, it has to precisely measure the capacitances of the capacitors or capacitive loads. FIGS. 1A~1C shows a conventional circuit diagram and its corresponding bias conditions for measuring a capacitance of a capacitor. As shown in FIG. 1A, the circuit configuration comprises four MOS (Metal oxide Semiconductor) transistors P1, P2, N1 and N2, in which the sources of the PMOS transistors P1 and P2 are coupled to a power source $V_{DD}$, and the sources of the NMOS transistors N1 and N2 are coupled to a power source GND. By measuring a current flowing through the capacitor C, its capacitance can be determined thereby. The measuring scheme using the above circuit is discussed in brief as follows.

Referring to FIG. 1A, non-synchronized voltages Vp, Vn are respectively applied to the gates of the PMOS transistor P1 and the NMOS transistor N1, and a voltage of $V_{DD}$ is applied to both of the gates of the PMOS transistor P2 and the NMOS transistor N2. Accordingly, a current flows from the PMOS transistor P1 to the capacitor C to charge the capacitor (current $I_{C1}$). Then, the capacitor C is discharged using a current I through the NMOS transistor N1 to the ground.

Referring to FIG. 1B, the non-synchronized voltages Vp, Vn are respectively applied to the gates of the PMOS transistor P2 and the NMOS transistor N2, and the voltage of $V_{DD}$ is applied to both of the gates of the PMOS transistor P1 and the NMOS transistor N1. Accordingly, a current flows from the PMOS transistor P2 to the capacitor C to charge the capacitor (current $I_{C2}$). Then, the capacitor C is discharged using a current I through the NMOS transistor N2 to the ground.

Next, referring to FIG. 1C, the non-synchronized voltages Vp, Vn are respectively applied to the gates of the PMOS transistor P1, P2 and the NMOS transistor N1, N2. Then, currents I flow through the NMOS transistors N1, N2 to the ground without flowing through the capacitor C.

A current flowing through the capacitor C can be calculated by adding the currents measured from FIGS. 1A, 1B and then subtracting the current measured from FIG. 1C, there by the capacitance of the capacitor C can be obtained. However, there are some drawbacks using the circuit above to measure the capacitance. It requires three steps to measure the current through the capacitor, which is complicated and not accurate.

SUMMARY OF THE INVENTION

According to the foregoing description, it is an object of this invention to provide a circuit for measuring a capacitance and a capacitance measuring method based upon the circuit, thereby the capacitance can be fast and accurately measured.

It is another object of this invention to provide a circuit for measuring a capacitance for reducing the pad number of the circuit and therefore simplifying its fabricating process.

According to the objects mentioned above, the invention provides a circuit for measuring a capacitance of a capacitive load. The circuit comprises elements as follows. A first type-1 MOS transistor (for example a PMOS transistor) has a source coupled to a first power source (for example $V_{DD}$). A second type-1 MOS transistor has a source coupled to a second power source, and a first input voltage that is applied to the gates of the first and the second type-1 MOS transistor. A first type-2 MOS transistor (for example a NMOS transistor) has a source coupled to a third power source having a level lower than the first power source (for example a ground level), and the drain of the first type-2 MOS transistor is coupled to the drain of the first type-1 MOS transistor. A second type-2 MOS transistor has a source coupled to the third power source, and the drain of the second type-2 MOS transistor is coupled to the drain of the second type-1 MOS transistor, and a second input voltage is applied to the gates of the first and the second type-2 MOS transistor, wherein the first and the second input voltages are non-synchronized. A capacitive load is coupled between the drains of the first and the second type-1 MOS transistors. And a pad is coupled to the drain of the second type-1 MOS transistor, wherein the third power source is applied to the pad such that the voltage at the two ends of the capacitive load are the same for measuring a first output current, and the pad is floated such that the voltage at the two ends of the capacitive load are different for measuring a second output current, and then a current flowing through the capacitive load is obtained by subtracting the first and the second output current. Thus, the capacitance of the capacitive load is calculated.

The invention further provides a circuit for measuring a capacitance of a capacitive load. The circuit comprises elements as follows. A first type-1 MOS transistor (for example a PMOS transistor) has a source coupled to a first power source (for example $V_{DD}$). A second type-1 MOS transistor has a source coupled to a second power source, and a first input voltage is applied to the gates of the first and the second type-1 MOS transistor. A first type-2 MOS transistor (for example a NMOS transistor) has a source coupled to a third power source having a level lower than the first power source (for example a ground level), and the drain of the first type-2 MOS transistor is coupled to the drain of the first type-1 MOS transistor. A second type-2 MOS transistor has a source coupled to the third power source, and the drain of the second type-2 MOS transistor is coupled to the drain of the second type-1 MOS transistor, and a second input voltage is applied to the gates of the first and the second type-2 MOS transistor, wherein the first and the second input voltages are non-synchronized. A capacitive load is coupled between the drains of the first and the second type-1 MOS transistors. And a MOS transistor is coupled to the drain of the second type-1 MOS transistor, wherein the MOS transistor is turned on such that the voltage at the two ends of the capacitive load are the same for measuring a first output current, and the MOS transistor is turned off such that the voltage at the two ends of the capacitive load are different for measuring a second output current, and then a current flowing through the capacitive load is obtained by subtracting the first and the second output current. Thus, the capacitance of the capacitive load is calculated.

The invention further provides a method for measuring a capacitive load. The capacitive load is coupled between a first and a second nodes, and drains of a first PMOS and a first NMOS transistors are coupled to the first node, and drains of a second PMOS and a second NMOS transistors are coupled to the second node, and a pad is coupled to the second node. First, a power source is applied to sources of the first and the second PMOS transistors, and a ground is applied to sources of the first and the second NMOS transistors. A first input voltage is applied to gates of the first and the second PMOS transistors and a second input voltage is applied to gates of the first and the second NMOS transistors simultaneously, wherein the first and the second input voltages are non-synchronized.

Then, the ground is applied to the pad such that the voltage at the two ends of the capacitive load are the same for measuring a first output current, and the pad is floating such that the voltage at the two ends of the capacitive load are different for measuring a second output current. By subtracting the first and the second output currents, a capacitor current flowing through the capacitive load is obtained. Thus, the capacitance of the capacitive load is calculated using the capacitor current.

By means of the circuit configuration above, the non-synchronized voltage is applied to both of the gates of the PMOS transistors P1, P2 and NMOS transistors N1, N2 as the circuit of the invention is activated. Therefore, the measurement of the capacitance can be faster and more accurate. Furthermore, for measuring the capacitance, it requires only two steps and therefore, the measuring steps can be reduced and simplified. Moreover, the pad number for the circuit is reduced and accordingly the manufacturing process for the circuit of the invention can be simplified.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings in which:

DESCRIPTION OF THE PREFERRED EMBODIMENT

The invention is a circuit configuration for measuring a capacitor load or capacitive load in an integrated circuit based upon a charge-based way. In regard to the circuit configuration, a pass-transistor can be used for replacing one pad to control the circuit. Therefore, the capacitance can be quickly and accurately measured, and furthermore the pad number of the circuit is reduced and the fabricating process is simplified.

Figure 2:
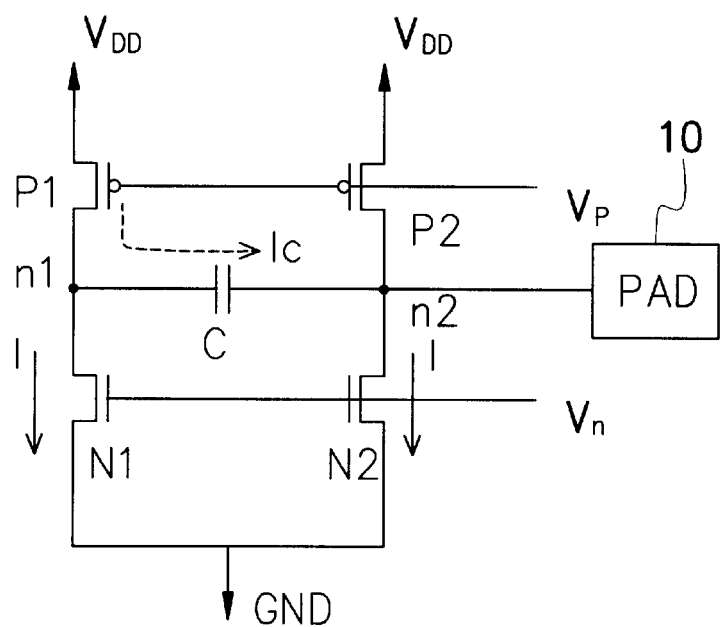
FIG. 2 shows a schematic circuit diagram for measuring a capacitance according to the embodiment of the invention.

FIG. 2 is a schematic circuit diagram for measuring a capacitance according to the embodiment of the invention.

Accompanying with FIG. 2, a detail process how to measure a capacitance of a capacitive load using the circuit is described below.

As shown in FIG. 2, the circuit for measuring the capacitance comprises four MOS transistors P1, P2, N1, N2 and a pad 10. The sources of the PMOS transistors P1, P2 are coupled to a power source $V_{DD}$, and the drains of the PMOS transistors P1, P2 are coupled to the drains of the NMOS transistors N1, N2. The sources of the NMOS transistors N1, N2 are coupled to a ground level GND. For convenience, a node n1 is defines as the connection of the drains of the PMOS transistor P1 and the NMOS transistor N1, and a node n2 is defines as the connection of the drains of the PMOS transistor P2 and the NMOS transistor N2.

The pad 10 is connected to the node n2 for control the operation of the circuit by applying suitable voltages. Additionally, the gates of the PMOS transistors P1, P2 are connected together to an input voltage Vp, while both the gates of the NMOS transistors N1, N2 are connected to an input voltage Vn. These two input voltage are termed a non-synchronized voltage. Furthermore, a capacitive load C is coupled between the nodes n1 and n2.

Figure 3:
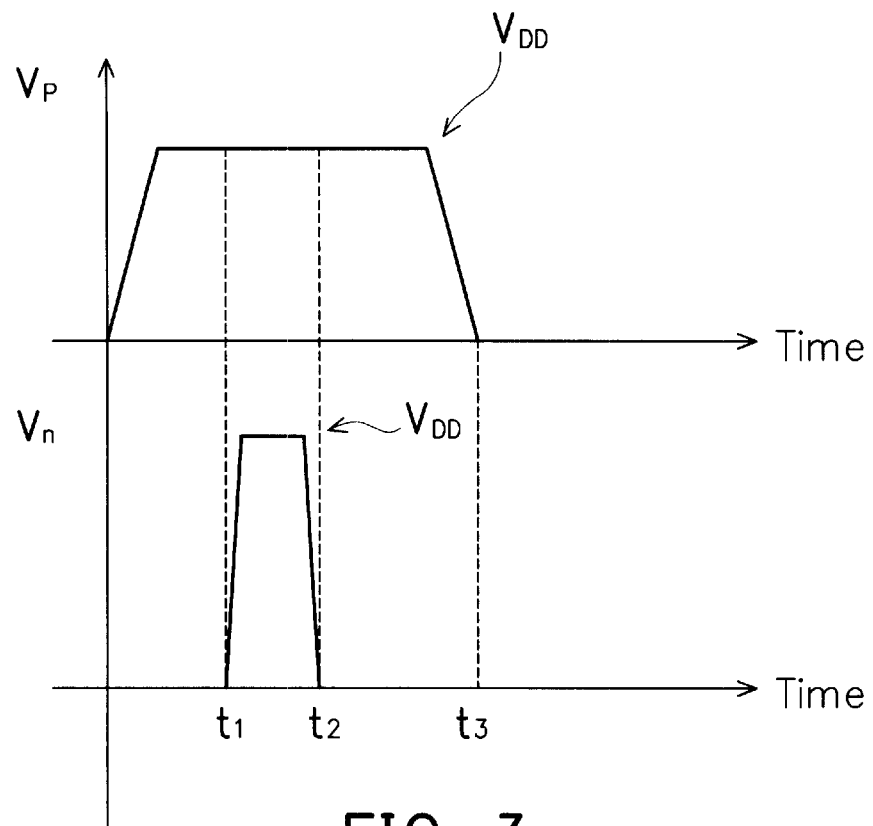
FIG. 3 shows a exemplary waveforms for a non-synchronized input signals.

FIG. 3 shows an example of the non-synchronized voltage comprising input voltages Vp, Vn respectively applied to the gates of the PMOS transistors P1, P2 and the gates of the NMOS transistors N1, N2. As shown, the input voltage Vp is high ($V_{DD}$) from time t0 to t3, while the input voltage Vn is high from time t1 to t2. Namely, the status transience of the voltage Vp, Vn is not occurred at the same time. The operation for circuit in FIG. 2 is described in detail below.

Referring to FIG. 2, each of the MOS transistors is properly biased. Namely, the sources of the sources of the PMOS transistors P1, P2 are coupled to a power source $V_{DD}$, and the sources of the NMOS transistors N1, N2 are coupled to a ground level GND. Additionally, of the non-synchronized voltage, the input voltage Vp is applied to the gates of the PMOS transistors P1, P2, while the input voltage Vn is applied to the gates of the NMOS transistors N1, N2 (Vp and Vn can be the waveform in FIG. 3 for example).

At this time, the PMOS transistors P1, P2 are off during time t0~t3. The NMOS transistors N1, N2 are on during time t1~t2, and are off during time t0~t1 and t2~t3. Therefore, during time t1~t2, the PMOS transistors P1, P2 are off and the NMOS transistors N1, N2 are on, thereby the voltages at the nodes n1, n2 are all pulled down to the ground level GND because the NMOS transistors N1, N2 are on.

The pad 10 is then connected to the ground level GND. Because the pad 10 is connected to the node n2, and the node n2 is pulled down to the ground level GND. Therefore, the voltages at the nodes n1, n2 are the same, the ground level GND. Therefore, no current passes through the capacitive load C, and the currents I flow through the turned on NMOS transistors N1, N2. Thus, an output current of 2I is measured.

The pad 10 is then floating, and therefore the voltage at the node n2 is determined by the status of the PMOS transistor P2 and the NMOS transistor N2. For example, when the PMOS transistor P2 is on and the NMOS transistor N2 is off, the voltage at the node n2 is pulled up to $V_{DD}$. Conversely, when the PMOS transistor P2 is off and the NMOS transistor N2 is on, the voltage at the node n2 is pulled up to the ground level GND. Accordingly, when the pad 10 is floating, the voltages at the nodes n1, n2 are different and then a current $I_C$ flows through the capacitive load C, charging the capacitor C. The capacitor C then discharged through the NMOS transistors N1, N2 with current 1. Thus, an output current of 2I+$I_C$ is measured.

Thereafter, by subtracting the two measured output currents, the current $I_C$ through the capacitive load C can be obtained. The capacitance of the capacitor C can be calculated using the current $I_C$ and the voltage drop between the nodes n1, n2.

Figure 4:
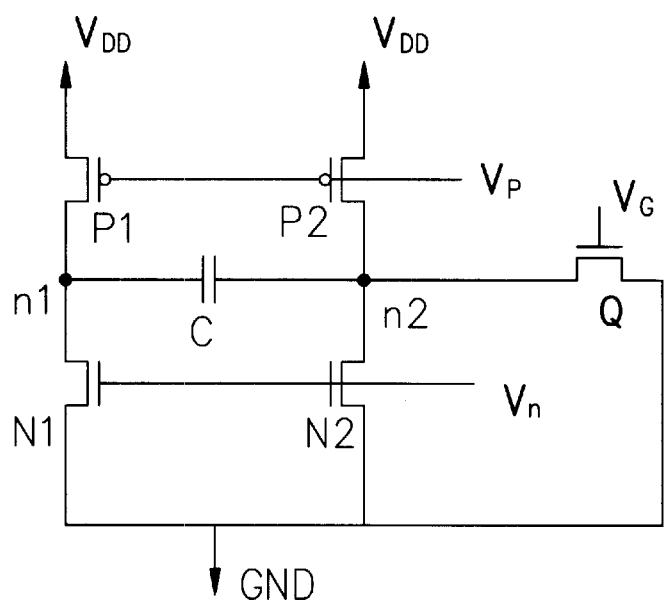
FIG. 4 shows another circuit diagram for measuring a capacitance according to the alternative embodiment of the invention.

FIG. 4 shows another circuit diagram for measuring a capacitance according to the alternative embodiment of the invention. A pass transistor is used for replacing the pad in FIG. 3.

As shown in FIG. 4, for example, the pass transistor Q is a NMOS transistor, wherein the drain is connected to the drains (node n2) of the PMOS transistor P1 and the NMOS transistor N2, and the source is connected to the ground GND. The operation for measuring the capacitance in FIG. 4 is the same as that in FIG. 2.

As the foregoing description, applying VDD to the gate of the pass transistor is equivalent to the condition that the pad 10 in FIG. 2 is connected to the ground level GND to pull down the voltage at the node n2. The NMOS transistor Q is then turned on and the voltage at the node n2 is connected to the ground, thereby the voltages at the nodes n1, n2 are the same. Additionally, applying the ground level GND to the gate of the pass transistor Q is equivalent to the condition that the pad 10 in FIG. 2 is floating to pull up the voltage at the node n2 (when the PMOS transistor P2 is on) to $V_{DD}$, or pull down the voltage at the node n2 (when the NMOS transistor N2 is on) to the ground GND. Accordingly, the NMOS transistor Q is turned off and the voltages at the nodes n1, n2 are different, resulting in that a current flows through the capacitive load and charges the capacitive load.

Namely, the embodiment uses a transistor switch to achieve grounding or floating the pad 10 in FIG. 2, thereby a current flowing through the capacitive load is measured to calculate the capacitance. As for the detail measuring process, it is the same as the previous embodiment, and no detail description is doubled here.

In the second embodiment, an NMOS transistor is the pass transistor Q as an example. However, for those skilled in the art, the NMOS transistor can be replaced by a PMOS transistor and the corresponding bias condition is changed accordingly.

Figure 1A:
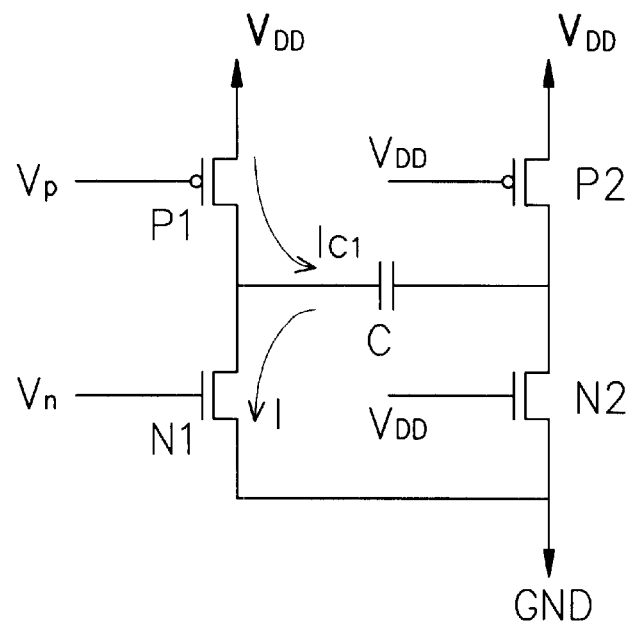
FIGS. 1A~1C shows a circuit diagram and bias conditions for measuring a capacitance according to the conventional method.
Figure 1B:
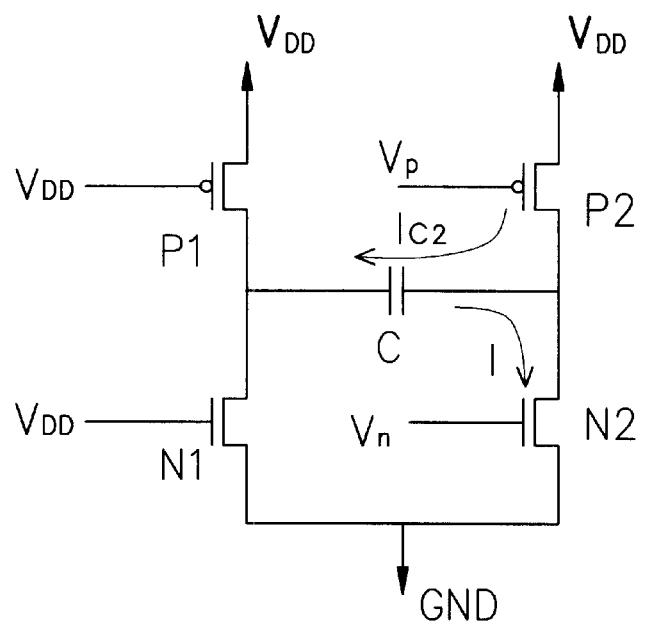
Figure 1C:
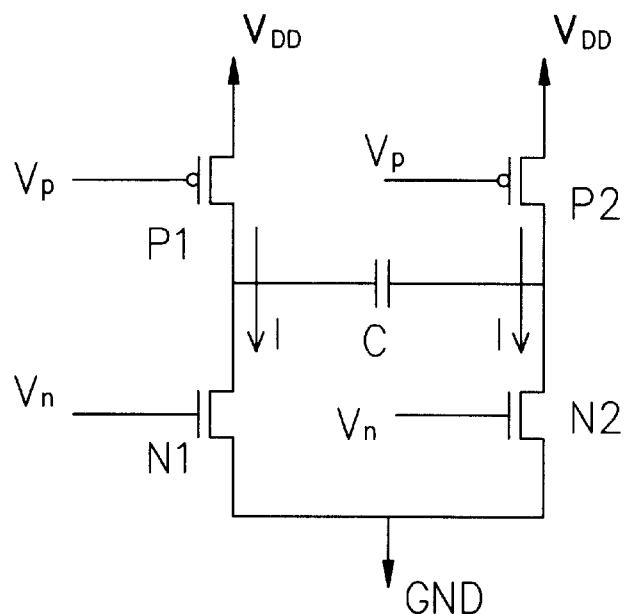

In summary, comparing with the conventional method and circuit, the non-synchronized voltage is applied to both of the gates of the PMOS transistors P1, P2 and NMOS transistors N1, N2 as the circuit of the invention is activated. It is not necessary to apply the non-synchronized voltage to the gates of the MOS transistors three times as described in the conventional circuit in FIGS. 1A~1C. Therefore, the measurement of the capacitance can be faster and more accurate.

Furthermore, according to the invention, for measuring the capacitance, it requires only two steps to apply suitable bias to the pad in FIG. 2 or to the gate of the pass-transistor in FIG. 4. Therefore, the measuring steps can be reduced and simplified.

Moreover, according to the circuit configuration of the invention, the total pad number is reduced. In regard to the conventional circuit in FIG. 1A, it requires seven pads: two for the power source VDD, four for the gates of the MOS transistors and one for the ground. Conversely, according to the present invention, it requires only six pads: two for the power source VDD, two for the gates of the MOS transistors (because the gates of the PMOS and NMOS transistors share the same pad) for receiving the non-synchronized voltage, one for the ground, and one for the pad. Therefore, the manufacturing process for the circuit of the invention can be simplified.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What claimed is:

1. A circuit for measuring a capacitance of a capacitive load, comprising:

a first type-1 MOS transistor, wherein a source of the first type-1 MOS transistor is coupled to a first power source;

a second type-1 MOS transistor, wherein a source of the second type-1 MOS transistor is coupled to a second power source, and a first input voltage is applied to the gates of the first and the second type-1 MOS transistor;

a first type-2 MOS transistor, wherein a source of the first type-2 MOS transistor is coupled to a third power source, and the drain of the first type-2 MOS transistor is coupled to the drain of the first type-1 MOS transistor;

a second type-2 MOS transistor, wherein the source of the second type-2 MOS transistor is coupled to the third power source, and the drain of the second type-2 MOS transistor is coupled to the drain of the second type-1 MOS transistor, and a second input voltage is applied to the gates of the first and the second type-2 MOS transistor;

a capacitive load coupled between the drains of the first and the second type-1 MOS transistors; and a pad, coupled to the drain of the second type-1 MOS transistor.

2. The circuit of claim 1, wherein the third power source has a level lower than the first power source.

3. The circuit of claim 1, wherein the first and the second input voltages are non-synchronized.

4. The circuit of claim 1, wherein the first and second type-1 transistors are PMOS transistor and the first and second type-2 transistors are NMOS transistor.

5. The circuit of claim 1, wherein the first and the second power source are the same level.

6. The circuit of claim 1, wherein the third power source is a ground level.

7. A circuit for measuring a capacitance of a capacitive load, comprising:

a first type-1 MOS transistor, wherein a source of the first type-1 MOS transistor is coupled to a first power source;

a second type-1 MOS transistor, wherein a source of the second type-1 MOS transistor is coupled to a second power source, and a first input voltage is applied to the gates of the first and the second type-1 MOS transistor;

a first type-2 MOS transistor, wherein a source of the first type-2 MOS transistor is coupled to a third power source, and the drain of the first type-2 MOS transistor is coupled to the drain of the first type-1 MOS transistor;

a second type-2 MOS transistor, wherein a source of the second type-2 MOS transistor is coupled to the third power source, and the drain of the second type-2 MOS transistor is coupled to the drain of the second type-1 MOS transistor, and a second input voltage is applied to the gates of the first and the second type-2 MOS transistor;

a capacitive load coupled between the drains of the first and the second type-1 MOS transistors; and a MOS transistor, coupled to the drain of the second type-1 MOS transistor.

8. The circuit of claim 7, wherein the third power source has a level lower than the first power source.

9. The circuit of claim 7, wherein the first and the second input voltages are non-synchronized.

10. The circuit of claim 7, wherein the first and second type-1 transistors are PMOS transistor and the first and second type-2 transistors are NMOS transistor.

11. The circuit of claim 7, wherein the first and the second power source are the same level.

12. The circuit of claim 7, wherein the third power source is a ground level.

13. The circuit of claim 7, wherein the MOS transistor is a PMOS or an NMOS transistor.

14. A circuit for measuring a capacitance of a capacitive load, comprising:

a first PMOS transistor, wherein a source of the first PMOS transistor is coupled to a power source;

a second PMOS transistor, wherein a source of the second PMOS transistor is coupled to the power source, and a first input voltage is applied to the gates of the first and the second PMOS transistor;

a first NMOS transistor, wherein a source of the first NMOS transistor is coupled to a ground, and the drain of the first NMOS transistor is coupled to the drain of the first type-1 MOS transistor;

a second NMOS transistor, wherein a source of the second NMOS transistor is coupled to the ground, and the drain of the second NMOS transistor is coupled to the drain of the second PMOS transistor, and a second input voltage is applied to the gates of the first and the second NMOS transistor;

a capacitive load coupled between the drains of the first and the second PMOS transistors; and a control element coupled to the drain of the second PMOS transistor.

15. The circuit of claim 14, wherein the first and the second input voltages are non-synchronized.

16. The circuit of claim 14, wherein the control element is a pad connected to the drain of the second PMOS transistor.

17. The circuit of claim 14, wherein the control element is a MOS transistor.

18. The circuit of claim 17, wherein the MOS transistor is a PMOS or an NMOS transistor.

19. A method for measuring a capacitive load, wherein the capacitive load is coupled between a first and a second nodes, and drains of a first PMOS and a first NMOS transistors are coupled to the first node, and drains of a second PMOS and a second NMOS transistors are coupled to the second node, and a pad is coupled to the second node, the method comprising steps of:

applying a power source to sources of the first and the second PMOS transistors;

applying a ground to sources of the first and the second NMOS transistors;

applying a first input voltage to gates of the first and the second PMOS transistors and a second input voltage to gates of the first and the second NMOS transistors simultaneously;

applying the ground to the pad for measuring a first output current;

floating the pad for measuring a second output current;

subtracting the first and the second output currents to obtain a capacitor current flowing through the capacitive load; and calculating a capacitance of the capacitive load using the capacitor current.

20. The method of claim 19, wherein the first and the second input voltages are non-synchronized.

* * * * *